United States Patent [19]
Beale et al.

[11] 4,109,061
[45] Aug. 22, 1978

[54] METHOD FOR ALTERING THE COMPOSITION AND STRUCTURE OF ALUMINUM BEARING OVERLAY ALLOY COATINGS DURING DEPOSITION FROM METALLIC VAPOR

[75] Inventors: Harry A. Beale, Jupiter, Fla.; Thomas E. Strangman, Manchester; Edward W. Taylor, Richland, Wash.

[73] Assignee: United Technologies Corporation, Hartford, Conn.

[21] Appl. No.: 858,912

[22] Filed: Dec. 8, 1977

[51] Int. Cl.$^2$ .................. B32B 15/00; C23C 15/00
[52] U.S. Cl. .................. 428/678; 204/192 C; 204/192 N; 427/39; 427/250; 428/679; 428/680; 428/684; 428/685
[58] Field of Search .................. 204/192 C, 192 N; 427/38, 39, 42, 50, 250; 428/678–680, 684, 685

[56] References Cited
U.S. PATENT DOCUMENTS

| | | | |
|---|---|---|---|
| 3,639,151 | 2/1972 | Krutenat | 427/39 |
| 3,649,225 | 3/1972 | Simmons, Jr. | 29/194 |
| 3,869,779 | 3/1975 | Gedwill et al. | 29/194 |
| 3,900,592 | 8/1975 | Kennedy et al. | 427/39 |

OTHER PUBLICATIONS

E. D. McClanahan et al., "Initial Work on the Application of Protective Coatings to Marine Gas Turbine Components by High-Rate Sputtering", ASME Publication 74-Gt-100 (1974).

Primary Examiner—Aaron Weisstuch
Attorney, Agent, or Firm—Edward J. Timmer

[57] ABSTRACT

The composition and structure of aluminum bearing overlay alloy coatings, such as MCrAlY type overlay coatings, are altered during deposition from a metallic vapor by biasing the substrate at a small negative potential relative to ground while the vapor is at least partially ionized. The coating layer deposited under such conditions is characterized by substantial freedom from leader defects and by a reduced aluminum content and resultant improved ductility. Such coating conditions can be incorporated in a preselected manner into conventional deposition techniques, such as vacuum vapor deposition and sputtering, to produce a variety of coating compositional and structural variations from a single coating alloy ingot source.

21 Claims, 5 Drawing Figures

METHOD FOR ALTERING THE COMPOSITION AND STRUCTURE OF ALUMINUM BEARING OVERLAY ALLOY COATINGS DURING DEPOSITION FROM METALLIC VAPOR

BACKGROUND OF THE INVENTION

1. Field of the Invention

The present invention relates to high temperature aluminum bearing alloy coatings commonly referred to as overlay coatings and to their application to superalloy substrates.

2. Description of the Prior Art

It is well known that the family of high temperature, oxidation-corrosion resistant coatings generally referred to as MCrAlY coatings can markedly extend the service life of gas turbine blades, vanes and like components; for example, see U.S. Patents to Evans et al, U.S. Pat. No. 3,676,085; Goward et al, U.S. Pat. No. 3,754,903; Hecht et al, U.S. Pat. No. 3,928,026; and Talboom, Jr. et al, U.S. Pat. No. 3,542,530, all of which are of common assignee herewith. These MCrAlY coatings are referred to as overlay coatings to denote the fact that they are deposited on the substrate as an alloy and act substantially independently of the substrate in providing oxidation-corrosion protection.

In the past, these types of coatings have been applied by vacuum vapor deposition, sputtering and plasma spraying techniques. Vacuum vapor deposition and sputtering are similar in that coating deposition is effected by exposing the substrate to a metallic vapor, usually in vacuum, the vapor condensing on the substrate surface to form the overlay coating, for example, see Steigerwald, U.S. Pat. No. 2,764,420 and Krutenat, U.S. Pat. No. 3,799,862. A disadvantage associated with the vapor depositing and sputtering of MCrAlY coatings is the formation of so-called leader defects in the coating. These defects are in the form of elongated voids between the columnar grains of the as-deposited coating and are known to reduce coating oxidation-corrosion resistance by providing convenient access paths for penetration of the corrosive environment into the coating. Generally, in the commercial manufacture of MCrAlY coated parts, such as turbine blades and vanes, the coated part is glass bead peened to close the leader defects. Of course, glass bead peening is an additional step in the process and increases the cost of producing an acceptable MCrAlY coated part.

Also, it has been thought highly desirable to provide a more ductile, that is, lower aluminum, MCrAlY layer between the substrate and an outer oxidation resistant MCrAlY layer of normal composition. The theory behind this thought is that the intermediate, lower aluminum layer would function as a ductile barrier zone to blunt and stop thermal cracks which are sometimes generated during high temperature service from propagating to the substrate and thereby exposing it to the harmful environment. However, currently used vapor deposition and sputtering techniques are not adapted to readily produce such coating compositional variations since the metallic vapor to which the substrate is exposed is usually generated from a single ingot source having a homogeneous composition. Although it may be possible to provide an ingot source of heterogeneous composition to deposit such a coating on the substrate, this would appear to be a costly solution due to the numerous steps required to fabricate such an ingot. Of course, two step coating processes utilizing different ingot source compositions can be employed to deposit a ductile MCrAlY layer first and then an oxidation resistant MCrAlY layer but these processes too would appear to be costly solutions.

SUMMARY OF THE INVENTION

It is an object of the present invention to provide means for altering the composition and structure of an aluminum bearing overlay alloy coating, such as MCrAlY-type coatings, as the coating is deposited from a metallic vapor.

It is another object of the invention to achieve such compositional and structural alterations during deposition from a metallic vapor wherein the vapor is generated from a single source of substantially homogeneous composition.

It is another object of the invention to deposit an MCrAlY-type overlay coating having a structure characterized by substantial freedom from leader defects.

It is still another object of the invention to deposit an MCrAlY-type overlay coating having an intermediate layer of reduced aluminum content and corresponding increased ductility between the substrate and an outer oxidation resistant layer to serve as a ductile barrier layer against propagation of thermal cracks.

The present invention involves the discovery that the composition and structure of aluminum bearing overlay alloy coatings, such as MCrAlY-type coatings, can be altered during deposition from a metallic vapor, such as during vacuum vapor deposition, sputtering and the like, by biasing the substrate at a small negative potential relative to ground while at least a portion of the metallic vapor is ionized. More specifically, it has been found that the aluminum content of the coating can be considerably reduced and that leader defects can be substantially eliminated when deposition occurs under such coating conditions. The coating layer thus deposited has been found to possess a highly useful combination of properties; namely, because of its substantial freedom from leader defects, the layer can serve as a preferred secondary substrate to reduce leader defect formation in an oxidation resistant MCrAlY layer subsequently deposited thereon under conventional coating conditions and also because of its reduced aluminum content, the layer exhibits improved ductility and can serve as a ductile barrier layer against thermal crack propagation during high temperature service. It is of significance that these compositional and structural alterations can be achieved even though a single ingot source of homogeneous chemistry is utilized to generate the vapor for coating.

In one embodiment of the invention, it is envisioned that the above-described coating conditions will be established during the initial portion of an otherwise conventional coating process cycle to deposit first on the substrate a reduced aluminum, ductile and leader-free MCrAlY layer and the biasing then removed to allow deposition of an MCrAlY layer of normal composition in conventional fashion atop the first layer, the relative thicknesses of the layers being varied as desired. Not only does the first compositionally and structurally modified MCrAlY layer subsequently serve as a preferred secondary substrate during the conventional portion of the coating cycle to reduce the number and severity of leader defects in the MCrAlY layer of normal composition but it also serves as a ductile barrier layer during high temperature service to minimize thermal crack propagation.

In another embodiment of the invention, it is contemplated that the above-described coating conditions will be established periodically for short time intervals during an otherwise conventional coating process cycle to deposit an overlay coating having a lamellar structure of alternating ductile and oxidation resistant MCrAlY layers and an overall composition corresponding essentially to the MCrAlY composition, the coating being substantially free from leader defects throughout a majority of the overall coating thickness. In this embodiment, it is preferred that the first layer be bias-deposited and that the last layer be deposited under conventional coating conditions.

In still another embodiment, the above-described coating conditions are maintained throughout the entire coating cycle to produce an oxidation resistant MCrAlY layer which is essentially free from leader defects. In this embodiment, the ingot source preferably contains an increased aluminum content to counteract the reduction in aluminum caused by substrate biasing.

These and other objects and advantages of the present invention will appear more fully from the following drawings and detailed description of the preferred embodiments.

DESCRIPTION OF THE PREFERRED EMBODIMENTS

Although the exemplary embodiments of the invention set forth in detail below relate to the vapor deposition of a NiCoCrAlY coating alloy, they are offered merely for purposes of illustration and are not intended to limit the scope of the present invention. The invention has general applicability to high temperature aluminum bearing overlay alloy coatings, especially those commonly referred to as MCrAlY type overlay coatings, which contain substantial amounts of aluminum to effect formation of an aluminum oxide barrier film on the surface for their protective effect. As used herein, MCrAlY-type overlay coating is intended to include coating alloys containing substantial chromium, for example, at least about 10 weight percent, substantial aluminum, for example, at least about 6 weight percent and yttrium, other rare earths or oxygen active elements, including hafnium, silicon and others, the basis metal of the coating alloy being nickel, cobalt and iron and mixtures thereof. Of course, other alloying elements may also be present depending upon the type of service to be encountered and other factors. The invention also has general applicability to coating processes wherein deposition is effected by exposing a substrate to a metallic vapor, vacuum vapor deposition, sputtering and the like being included among such processes.

Figure 1:
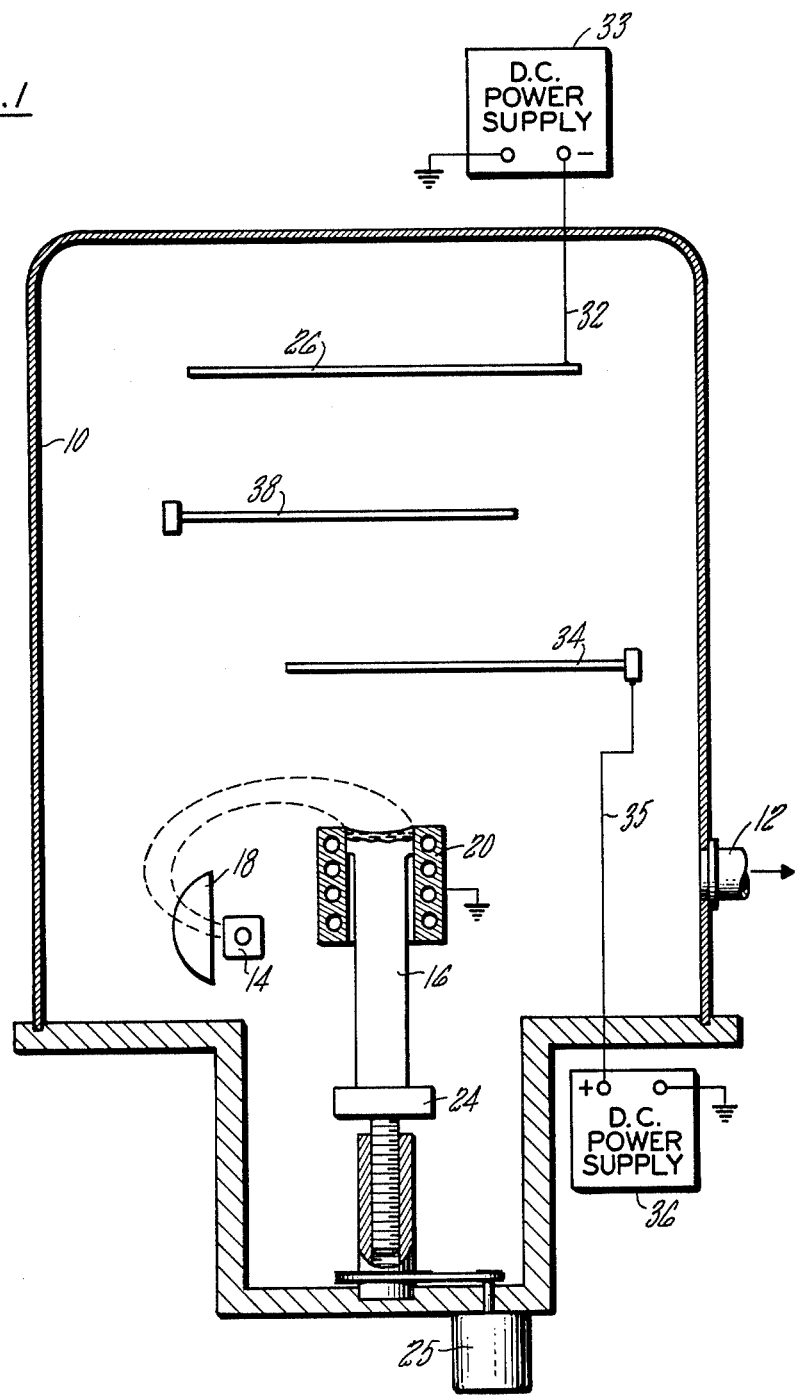
FIG. 1 is a schematic illustration, partially in section, of a vacuum vapor deposition apparatus useful in the present invention.

Referring to FIG. 1, there is shown a vacuum chamber 10 having an exit port 12 leading to a suitable high-vacuum pump, preferably of the diffusion type, for the rapid and continuous evacuation of the chamber. Located inside the chamber, there is shown an electron gun 14 for generating a beam of charged particles to impinge upon and vaporize a homogeneous ingot 16 of MCrAlY source metal, such as, for illustration, an Ni-CoCrAlY ingot of the following substantially homogeneous composition, by weight, 42.50% Ni, 22.50% Co, 21.35% Cr, 13.20% Al and 0.045% Y. It will be appreciated by those skilled in the art that the electron beam is suitably directed by conventional magnetic deflection pole pieces 18 such as so-called elephant ear electromagnets. Of course, the arrangement of the electron beam gun within the vacuum chamber is a function of design. And, it will also be appreciated that multiple ingots may also be used and vaporized under certain circumstances.

The ingot 16 is made movable and is slidably received at its upper end by an annular water-cooled crucible 20. The ingot is normally continuously fed upwardly into the crucible at a controlled rate by a feed system, including chuck 24 and motor 25, to maintain a constant pool height. In this way, the focused electron beam will impinge only on the desired pool surface area.

The substrate to be coated is disposed within the vacuum chamber 10 vertically above the ingot 16 and is illustrated as a flat plate 26 of nickel base superalloy commonly referred to as MAR-M200 + Hf of nominal composition, by weight, 9.0% Cr, 10.0% Co, 2.0% Ti, 5.0% Al, 12.5% W, 1.0% Cb, 0.015% B, 2.0% Hf, 0.11% C, balance essentially nickel. The plate is positioned as close as possible to the surface of the molten source pool for maximum coating efficiency but far enough removed therefrom to prevent coating contamination by splash from the pool. In order to bias the plate 26 at a small negative potential relative to ground during deposition, the plate is connected to electrical lead 32 which, in turn, is connected to a conventional D.C. voltage source 33. Positioned between the plate 26 and ingot 16 is anode 34 which is connected by electrical lead 35 to another conventional D.C. voltage source 36. When activated, the anode functions to ionize a portion of the metallic vapor emanating from the molten source pool. A shutter 38 is positioned between the plate and the anode 34 to prevent deposition until optimum coating conditions are established in the chamber.

As already mentioned, the invention involves the discovery that during conventional coating processes, the composition and structure of the NiCoCrAlY coating, more generally aluminum bearing overlay alloy coatings, can be altered by biasing the substrate at a small negative potential relative to ground while the metallic vapor to which the substrate is exposed is at least partially ionized. In one embodiment of the invention, the flat plate 26 of MAR-M200 + Hf is biased at a small negative potential of 60V during the first 7 minutes of deposition to deposit a 2 mil thick initial compositionally and structurally modified NiCoCrAlY layer. Thereafter, the bias potentials on the substrate and anode are removed and conventional vacuum vapor deposition conducted until a 5 mil thick layer is deposited over the first. The overall coating parameters utilized are shown in Table I.

TABLE I

| Crucible Diameter (in.) | EB Gun Volts | Amps | Substrate Volts | Amps | Anode Volts | Amps |
|---|---|---|---|---|---|---|
| 3.5 | 10,000 | 4.2 | 60 | 5 | 20 | 100 |

Figure 2:
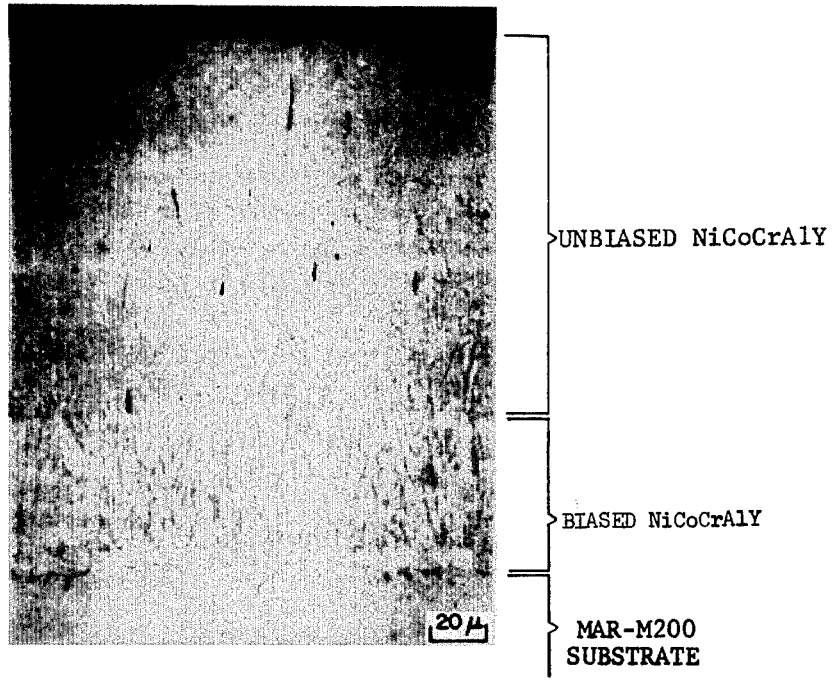
FIG. 2 is a cross-section through a NiCoCrAlY coating deposited by initially biasing the substrate and anode and then removing the bias for the remainder of vacuum vapor deposition.
Figure 3:
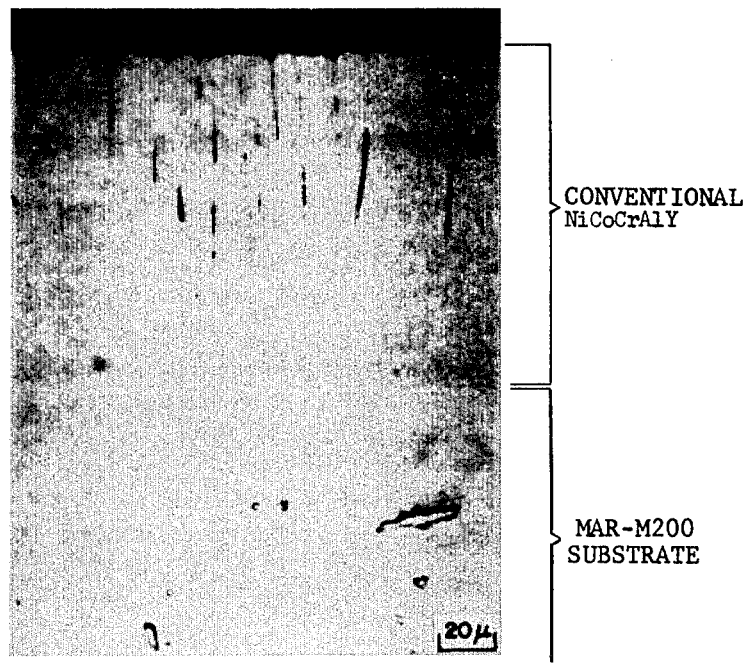
FIG. 3 is a cross-section through a NiCoCrAlY coating deposited by conventional vacuum vapor deposition.

FIG. 2 shows a cross-section through the coating produced by the above procedure. From the Figure, it is apparent that the initial bias-deposited layer exhibits a reduced aluminum content (determined from X-ray fluorescence analysis to be approximately 8% Al, by weight, as compared to 12.5% Al in the unbias-deposited layer) and reduced beta (NiAl) phase and is essentially free of leader defects. When the coating of FIG. 2 is compared to that of FIG. 3 produced by vacuum vapor deposition without the initial bias deposition stage, it is also apparent that the NiCoCrAlY layer deposited in conventional manner on top of the bias-deposited layer exhibits a significant reduction in the number and severity of leader defects. From these observations, it is now apparent that the coating layer produced during bias deposition exhibits highly useful properties; namely, the initial bias-deposited layer acts as a preferred secondary substrate during subsequent coating deposition to reduce the number and severity of defects in the conventional MCrAlY layer deposited thereon and as a result of its reduced aluminum content, the bias-deposited layer possesses greater ductility than the unbias-deposited layer and therefore acts as a ductile barrier layer to inhibit thermal crack propagation from the outer oxidation resistant layer to the substrate during high temperature service.

In another embodiment of the invention, the flat plate 26 and anode 34 are biased at the voltages described above periodically for short time intervals during the conventional coating process. Typical bias-unbias coating sequences are shown in Table II.

TABLE II

| Mode | Schedule 1 Minutes | Schedule 2 Minutes | Schedule 3 Minutes |
|---|---|---|---|
| Bias | 6 | 4 | 3 |
| Unbias | 3 | 4 | 6 |
| Bias | 4 | 3 | 3 |
| Unbias | 3 | 4 | 9 |
| Bias | 4 | 3 | 7 |
| Unbias | 3 | 4 | 7 |

Figure 4:
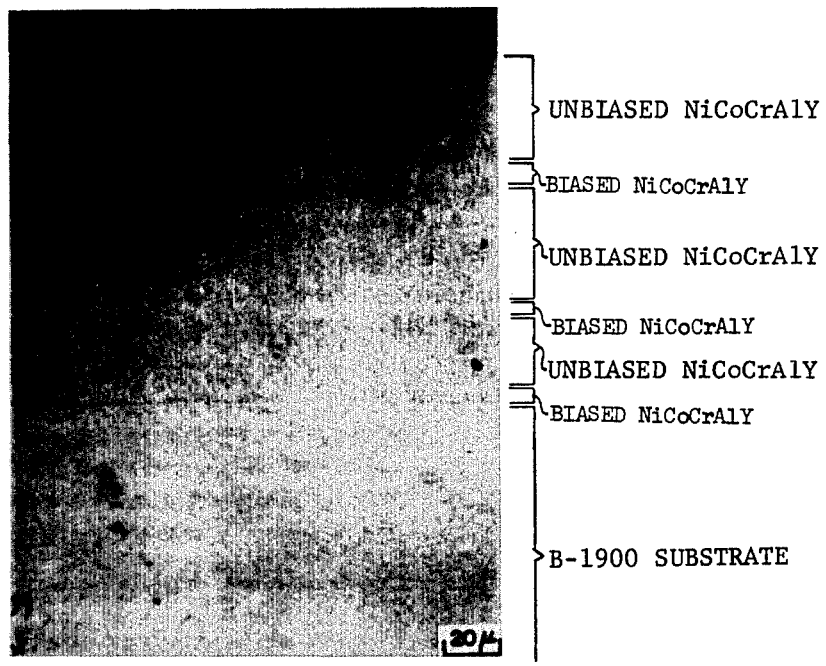
FIG. 4 is a cross-section through a NiCoCrAlY coating deposited by periodically biasing the substrate and anode for short times during vacuum vapor deposition.

FIG. 4 shows a cross-section of a NiCoCrAlY coating deposited by schedule 3 on a nickel base superalloy substrate commonly known as B-1900 of nominal composition, by weight, 8.0% Cr, 10.0% Co, 1.0% Ti, 6.0% Al, 6.0% Mo, 4.3% Ta, 0.11% C, 0.7% Zr, 0.0015% B, balance essentially nickel. From the figure, it is apparent that the coating has a lamellar structure of alternating ductile and oxidation resistant layers and that the bias-deposited layers are of reduced aluminum content, reduced beta phase and are essentially free of leader defects. In addition, it is also apparent that the majority of the coating thickness, including bias and unbias-deposited layers, is essentially free of leader defects, the defects being confined for the most part to the outer unbias-deposited layer. As a result of the small thickness of the bias-deposited layers as compared to the unbias-deposited layers, the overall composition of the coating closely approximates that of the NiCoCrAlY ingot source and offers the excellent oxidation-corrosion resistance associated with the MCrAlY coatings.

Figure 5:
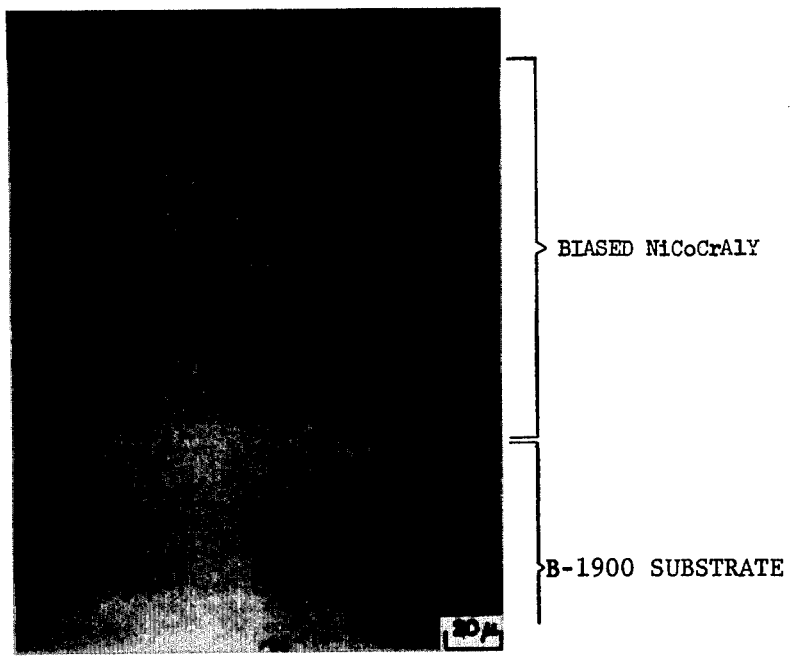
FIG. 5 is a cross-section through a coating deposited by biasing the substrate and anode throughout the entire vacuum vapor deposition process.

In still another embodiment, the flat plate 26 and anode 34 are biased during the entire deposition process. As shown in FIG. 5 for a B-1900 nickel base superalloy substrate and the NiCoCrAlY coating, the coating is essentially free from leader defects except for the outermost portion. The coating also exhibits a reduced aluminum content (8% by weight) throughout the thickness, which, of course, adversely affects the oxidation resistance of the coating. Of course, to deposit an oxidation resistant MCrAlY coating under these conditions, the ingot composition can be provided with an increased aluminum content so that an MCrAlY coating of normal aluminum content is ultimately deposited.

Those skilled in the art will recognize that the voltages applied to the substrate and anode during deposition will vary depending upon the particular coating alloy being vaporized and deposited and other factors. However, it has been found that a substrate voltage of from about −10V to about −80V volts and an anode voltage from about 10V to about 40V give satisfactory results with most MCrAlY coating alloys during vacuum vapor deposition. Of course, the thickness of the individual coating layers can also be varied to suit particular needs. The reduction in the aluminum content of the coating effected by biasing varies somewhat with the potentials applied; however, for potentials in the range from −60V to −70V for the substrate and 18V to 24V for the anode, the aluminum content of the bias-deposited coating is about 36% less than that in the MCrAlY source composition.

The numerous advantages and improvements the present invention has to offer are now apparent. For the first time, an MCrAlY overlay coating having layers of variable aluminum content can be provided from a single homogeneous ingot source. In terms of commercial coating practice, this feature is highly important since a one-step coating procedure can be used. In the prior art, two or more separate coating steps are required to obtain a similar coating. As a result of the reduced number and severity of leader defects in the coating produced by the invention, glass bead peening of the coated article may be eliminated as a production step, especially when the periodic bias-unbias coating or full time bias procedures are employed. And, the presence of at least one low aluminum, ductile MCrAlY layer between the substrate and outer, higher aluminum layer should inhibit propagation of thermal cracks to the substrate and thus extend the service life of the coated part. The net effect of the inventive method is to produce a higher quality coated part at a significantly reduced cost. The above advantages make the inventive method especially attractive in producing large numbers of coated gas turbine engine parts, such as MCrAlY coated turbine blades.

Of course, those skilled in the art will recognize that the invention is not limited to vacuum vapor deposition processes. It finds broad application in other coating processes, such as sputtering, wherein deposition is effected by exposing the substrate to a metallic vapor. In sputter coating processes wherein a portion of the metallic vapor emanating from the source is ionized, it may be possible to dispense with the anode 34 shown in FIG. 1. In that process, biasing of the substrate alone at the prescribed small negative voltage during exposure to the partially ionized vapor is sufficient to achieve the results and benefits of the present invention. As with vacuum vapor deposition, the reduction in aluminum content of the as-deposited sputter coating will vary with the bias potential of the substrate. Thus, by controlling the bias potential, the aluminum content of the sputtered coating can be directly controlled. Those skilled in the art will also recognize that the bias potential of the substrate may be varied continuously during exposure to the partially ionized vapor to produce a more or less graded MCrAlY coating in terms of its aluminum content.

Although the invention has been shown and described with respect to preferred embodiments, it should be understood by those skilled in the art that various changes may be made therein without departing from the spirit and scope of the invention.

Having thus described a typical embodiment of our invention, that which we claim as new and desire to secure by Letters Patent of the United States is:

1. In coating a substrate with an oxidation resistant aluminum bearing overlay alloy coating wherein the coating is deposited on the substrate from a metallic vapor and wherein the coating is susceptible to the formation of leader defects therein during deposition and to thermal cracking during high temperature service, the steps for a preselected time during deposition of:
    biasing the substrate at a small negative potential of about −10 volts to about −80 volts relative to ground while at least a portion of the vapor is ionized to deposit a compositionally and structurally modified coating layer and then removing the bias from the substrate to deposit an outer oxidation resistant coating layer of normal composition atop the modified layer, the modified, bias-deposited layer intermediate the substrate and outer coating layer being characterized by freedom from harmful leader defects and by a sufficient depletion in aluminum to render the layer ductile as compared to the outer oxidation resistant layer;
    whereby said intermediate layer serves as a preferred secondary substrate during the subsequent coating step to reduce the number and severity of leader defects in the oxidation resistant layer deposited thereon and as a ductile barrier layer during subsequent high temperature service to inhibit thermal crack propagation to the substrate.

2. The method of claim 1 wherein the metallic vapor is sputtered from a single source having an MCrAlY-type composition.

3. The method of claim 1 wherein the metallic vapor is generated by thermal vaporization of a single source having an MCrAlY-type composition.

4. The method of claim 3 wherein ionization of the thermally generated vapor is effected by biasing an anode at a small positive potential of about 10 volts to about 40 volts relative to ground and establishing contact between the biased anode and at least a portion of the metallic vapor.

5. The method of claim 1 wherein the substrate to be coated is a superalloy gas turbine airfoil.

6. A method for coating a substrate with an oxidation and thermal crack resistant MCrAlY-type overlay coating wherein coating deposition is effected by exposing the substrate to a metallic vapor, comprising:
    (a) initially for a preselected time, biasing the substrate at a small negative potential of about −10 volts to about −80 volts relative to ground while a portion of the vapor is ionized to deposit a compositonally and structurally modified layer being characterized by the MCrAlY composition being sufficiently depleted in aluminum to render the layer ductile as compared to an MCrAlY layer of normal composition and by freedom from harmful leader defects; and
    (b) terminating biasing of the substrate for the remainder of deposition to deposit an oxidation resistant MCrAlY coating layer of normal composition on said first modified layer, said first layer serving as a preferred secondary substrate during subsequent deposition to reduce the number and severity of leader defects in the oxidation resistant layer deposited thereon and as a ductile barrier layer during subsequent high temperature service to inhibit thermal crack propagation to the substrate.

7. A coated substrate produced by the method of claim 6.

8. The method of claim 6 wherein the metallic vapor is sputtered from a single source having the MCrAlY composition.

9. The method of claim 6 wherein the metallic vapor is generated by thermal vaporization of a single source having the MCrAlY composition.

10. The method of claim 9 wherein ionization of the thermally generated vapor is effected by biasing an anode at a small positive potential of about 10 volts to about 40 volts relative to ground and establishing contact between the biased anode and at least a portion of the metallic vapor.

11. A method for coating a substrate with an oxidation and thermal crack resistant MCrAlY-type overlay coating wherein coating deposition is effected by exposing the substrate to a metallic vapor, comprising:
    (a) initially for a preselected time, biasing the substrate at a small negative potential of about −10 volts to about −80 volts relative to ground while a portion of the vapor is ionized to deposit a compositionally and structurally modified coating layer first on the substrate, the modified layer being characterized by the MCrAlY composition being sufficiently depleted in aluminum to render the layer ductile as compared to an MCrAlY layer of normal composition and by freedom from harmful leader defects;
    (b) terminating biasing of the substrate for a preselected time interval to deposit an oxidation resistant MCrAlY coating layer of normal composition on said first modified layer, said first layer serving as a preferred secondary substrate to reduce the number and severity of leader defects in the oxidation resistant layer deposited thereon;
    (c) repeating steps (a) and (b) in sequence, step (b) being the final deposition step, until a coating of desired thickness is deposited, said coating being characterized by a lamellar structure of said ductile and oxidation resistant layers in alternating sequence and by freedom from harmful leader defects throughout a majority of the coating thickness.

12. The coated substrate produced by the method of claim 11.

13. The method of claim 11 wherein substrate biasing is established for short time intervals as compared to the intervals when it is terminated so that the ductile modified layers are thin as compared to the MCrAlY layers of normal composition, said overall coating composition thereby closely approximating the MCrAlY composition.

14. The method of claim 11 wherein the metallic vapor is sputtered from a single source having the MCrAlY composition.

15. The method of claim 11 wherein the metallic vapor is generated by thermal vaporization of a single source having the MCrAlY composition.

16. The method of claim 15 wherein ionization of the thermally generated vapor is effected by biasing an anode at a small positive potential of about 10 volts to about 40 volts relative to ground and establishing contact between the biased anode and at least a portion of the metallic vapor.

17. In a method for coating a substrate with an oxidation resistant MCrAlY-type overlay coating wherein coating deposition is effected by exposing the substrate to a metallic vapor, the improvement comprising depositing an essentially leader-free MCrAlY coating by:
   (a) generating metallic vapor from a source having the desired MCrAlY composition except for an increased aluminum content; and
   (b) biasing the substrate at a small negative potential of about −10 volts to about −80 volts relative to ground while a portion of the vapor is ionized until the desired coating thickness is deposited, said biasing causing the coating to be devoid of harmful leader defects throughout a majority of its thickness and causing an aluminum reduction from the source to the substrate so that the coating has the desired MCrAlY composition.

18. The coated substrate produced by the method of claim 17.

19. The method of claim 17 wherein the metallic vapor is sputtered from a single source having the MCrAlY composition of increased aluminum content.

20. The method of claim 17 wherein the metallic vapor is generated by thermal vaporization of a single source having the MCrAlY composition of increased aluminum content.

21. The method of claim 17 wherein ionization of the thermally generated vapor is effected by biasing an anode at a small positive potential of about 10 volts to about 40 volts relative to ground and establishing contact between the biased anode and at least a portion of the metallic vapor.

* * * * *